United States Patent
Lai et al.

(10) Patent No.: US 9,583,350 B2
(45) Date of Patent: Feb. 28, 2017

(54) MEMORY DEVICE AND METHOD FOR FABRICATING THE SAME

(71) Applicant: MACRON IX INTERNATIONAL CO., LTD., Hsinchu (TW)

(72) Inventors: Sheng-Chih Lai, Zhubei (TW); Wei-Chen Chen, Taoyuan County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/589,006

(22) Filed: Jan. 5, 2015

(65) Prior Publication Data

US 2016/0197041 A1    Jul. 7, 2016

(51) Int. Cl.
*H01L 29/76* (2006.01)
*H01L 21/28* (2006.01)
*H01L 27/115* (2006.01)

(52) U.S. Cl.
CPC .. *H01L 21/28282* (2013.01); *H01L 27/11565* (2013.01); *H01L 27/11582* (2013.01)

(58) Field of Classification Search
CPC .......................... H01L 21/28282; H01L 23/535
See application file for complete search history.

(56) References Cited

U.S. PATENT DOCUMENTS

| | | | |
|---|---|---|---|
| 2010/0044778 A1* | 2/2010 | Seol | H01L 21/28273 257/326 |
| 2012/0032250 A1* | 2/2012 | Son | H01L 21/28273 257/324 |

* cited by examiner

*Primary Examiner* — Marc Armand
*Assistant Examiner* — Sarah Salerno
(74) *Attorney, Agent, or Firm* — McClure, Qualey & Rodack, LLP

(57) ABSTRACT

A memory device comprises a first conductive stripe, a first memory layer, a first conductive pillar, a first dielectric layer and a first conductive plug. The first conductive strip extends along a first direction. The first memory layer extends along a second direction adjacent to and overlapping with the first conductive stripe to define a first memory area thereon. The first conductive pillar extends along the second direction and overlapping with the first memory area. The first dielectric layer extends along the second direction adjacent to the first conductive stripe, the first memory layer and the first conductive pillar. The first conductive plus extends along the second direction and at least overlaps with a portion of the first conductive stripe, wherein the first conductive plus is electrically insulated from the first conductive stripe, the first memory layer and the first conductive pillar by the first dielectric layer.

11 Claims, 9 Drawing Sheets

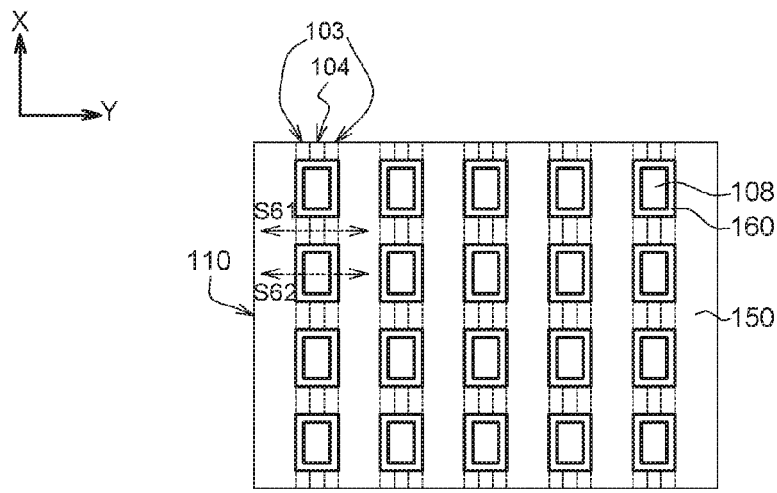
FIG. 6A
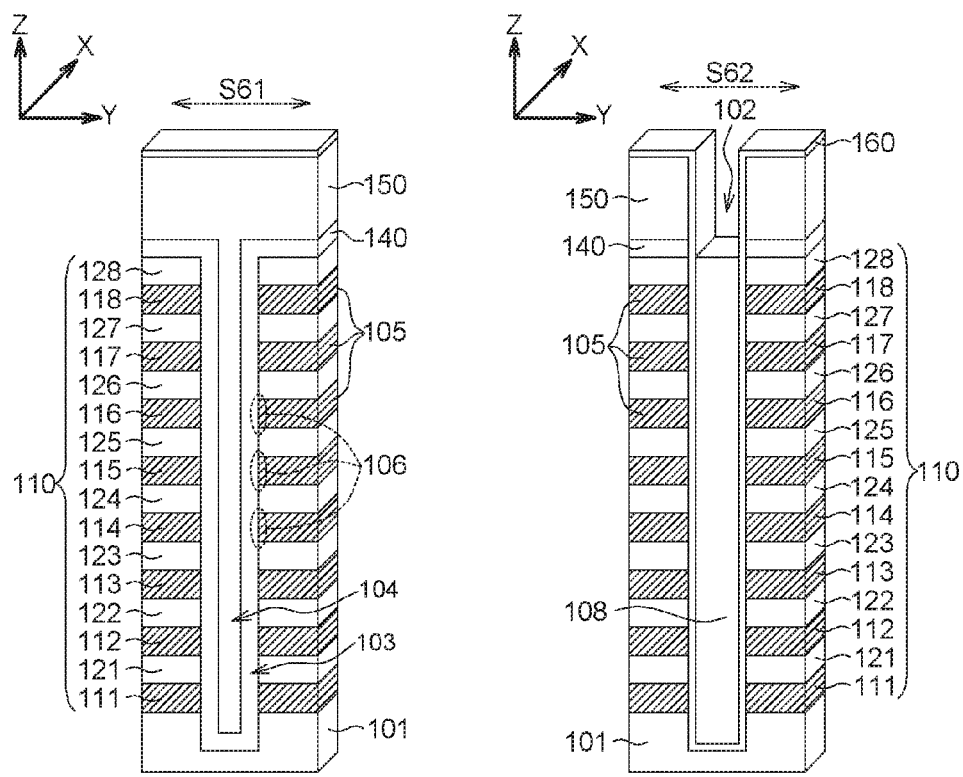
FIG. 6B
FIG. 6C

MEMORY DEVICE AND METHOD FOR FABRICATING THE SAME

BACKGROUND

Technical Field

The disclosure in generally relates to a non-volatile memory device and method for fabricating the same, and more particularly to a three dimension (3D) non-volatile memory device and method for fabricating the same.

Description of the Related Art

In a non-volatile memory device, for example a NAND flash memory device, a plurality of memory cells are typically connected in series between a source line and a bit line by a mono-silicon/poly silicon based conductive strip; and the mono-silicon/poly silicon based conductive strip may be implanted with ion dopants in order to reduce the series resistance of the cells string in series. However, it is difficult to perform an ion implantation process to dope the mono-silicon/poly silicon based conductive strips of a 3D NAND flash memory device, since these mono-silicon/poly silicon based conductive strips are imbedded in a multi-layer stack including a plurality of the conductive strips and a plurality of insulating layers alternately stacked along the vertical direction. To delivering ion dopants into these mono-silicon/poly silicon based conductive strips imbedded in the multi-layer stack may make the process for fabricating the 3D NAND flash memory device more complicated than that for fabricating a two dimension (2D) NAND flash memory device; and the thermal budget for 3D NAND flash memory device could be significantly increased. Besides, the ion implantation is nearly isotropic, thus the dopants that are diffused in an undesirable direction may inversely affect the erase/program operation of the 3D NAND flash memory device. In the worst case, it may lead the 3D NAND flash memory device failure.

Therefore, there is a need of providing an improved memory device and method for fabricating the same to obviate the drawbacks encountered from the prior art.

SUMMARY

One aspect of the present invention is to provide a memory device, wherein the memory device comprises a first conductive stripe, a first memory layer, a first conductive pillar, a first dielectric layer and a first conductive plug. The first conductive strip extends along a first direction. The first memory layer extends along a second direction to overlap with the first conductive stripe, so as to define a first memory area at a position where the first memory layer overlaps with first the conductive stripe. The first conductive pillar extends along the second direction adjacent to the first memory layer and overlaps with the first memory area. The first dielectric layer extends along the second direction adjacent to the first conductive stripe, the first memory layer and the first conductive pillar. The first conductive plus extends along the second direction and at least overlaps with a portion of the first conductive stripe, wherein the first conductive plus is electrically insulated from the first conductive stripe, the first memory layer and the first conductive pillar by the first dielectric layer.

According to another aspect of the present invention, a method for fabricating a memory device is disclosed, wherein the method comprises steps as follows: Firstly, a multi-layer stack is formed on a substrate. The multi-layer stack is then patterned to form a plurality of ridge-shaped stacks each of which at least comprises a conductive stripe extending along a first direction. Next, a memory material layer is formed on a bottom and sidewalls of a trench defined by the ridge-shaped stacks. A conductive material layer is then formed on the ridge-shaped stacks and fills the trench. Subsequently, the conductive material layer and the memory material layer are patterned to define a plurality of through holes passing through the trench, so as to expose a portion of the substrate, wherein the patterned memory material layer comprises at least one memory layer defined in the trench; the patterned conductive material layer comprises at least one conductive pillar defined in the trench; and a memory area is defined on a position where the memory layer overlaps with the conductive stripe. Next, a dielectric layer is formed on sidewalls of the through holes and the exposed portions of the substrate. A plurality of conductive plugs are then formed to partially fill the through holes respectively, so as to make each of the conductive plugs at least overlap with a portion of the corresponding first conductive stripe. A plurality of dielectric plugs are then formed to fill the through holes. Thereafter, the conductive material layer is patterned again to form at least one word line extending along a third direction on top surfaces of the ridge-shaped stacks and electrically contacting with the conductive pillar.

In accordance with the aforementioned embodiments of the present invention, a memory device and method for fabricating the same are provided. In some embodiments of the present invention, the memory device comprises a plurality of level structures, and each of which comprises a plurality of memory cells connected in series by a conductive stripe extending along a first direction. Each of the memory cells has a memory layer and a conductive pillar extend along a second direction, wherein the memory layer overlaps with the conductive stripe and a memory area is defined on a position where the memory layer overlaps with the conductive stripe. The conductive pillar extends adjacent to the memory layer and overlaps with the memory area. A conductive plug parallel to the conductive pillars of two adjacent memory cells is provided between the two conductive pillars, wherein the conductive plug at least overlaps with a portion of the conductive stripe that connects the two memory cells in series, and is insulated from the two memory cells and the conductive stripe by a dielectric layer.

Due to the arrangements of the conductive plug and the dielectric layer that are disposed between the two adjacent memory cells, the conductive plug may serve as a floating gate of the conductive stripe. When the memory device performs an erase/program process, the conductive pillars of the memory cells may be charged with a certain voltage; and an electric field which may couple with the nearby conductive pillars may induce a voltage on the conductive plug. Thus, an inverse layer may be formed in the conductive stripe due to the voltage potential induced on the conductive plug. As a result, the series resistance of the conductive stripe connecting the two adjacent memory cells may be reduced. Therefore, it is not necessary to perform an ion implantation in order to reduce the series resistance of the cell strings during the process for fabricating a 3D NAND flash memory device; and the conventional problems, such as complex manufacturing process, high thermal budget and interference on erase/program operation can be resolved by the present approach.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 6A is a top view illustrating the result after the conductive plugs are formed on the structure depicted in FIG. 5A;

FIG. 6B is a prospective view of the structure taken along with the line S61 depicted in FIG. 6A;

FIG. 6C is a prospective view of the structure taken along with the line S62 depicted in FIG. 6A;

DETAILED DESCRIPTION

Figure 1A:
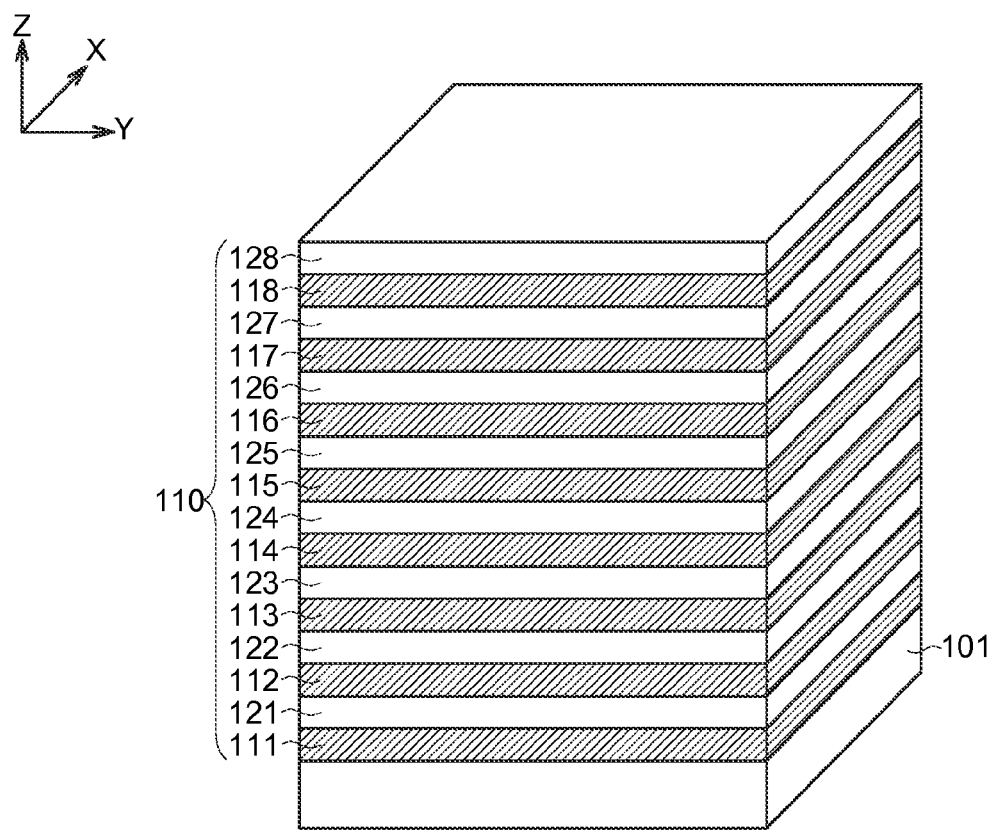
FIG. 1A is a prospective view illustrating a multi-layer stack in accordance with one embodiment of the present invention.

The embodiments as illustrated below provide a 3D memory device and method for fabricating the same to reduce series resistance of a conductive stripe used to connecting two adjacent memory cells in series without delivering ion implants into the conductive stripe. The present invention will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

Figure 1B:
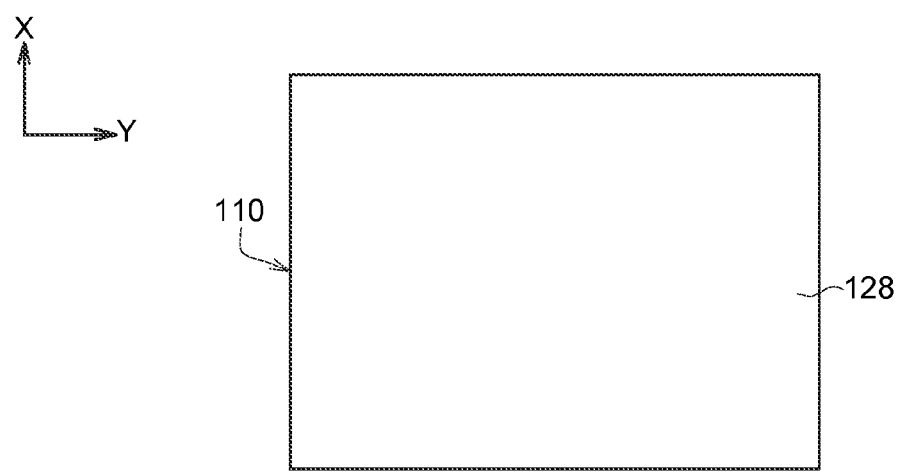
FIG. 1B is a top view illustrated in accordance with the structure depicted FIG. 1A.

The method for fabricating a 3D memory device 100 comprises several steps as follows: Firstly, a multi-layer stack 110 is formed on a substrate 101. FIG. 1A is a prospective view illustrating the multi-layer stack 110 in accordance with one embodiment of the present invention; FIG. 1B is a top view illustrated in accordance with the structure depicted in FIG. 1A. In some embodiments of the present invention, the multi-layer stack 110 is formed on a semiconductor substrate 101. The multi-layer stack 110 comprises a plurality of conductive layers 111-118, and a plurality of insulating layers 121-128. In the present embodiment, the insulating layers 121-128 are alternately stacked with the conductive layer 111-118 on the substrate 101 along a Z-direction as illustrated in FIG. 1A. As a result, the conductive layer 111 is disposed at the bottom of the multi-layer stack 110, and the insulating layer 128 is disposed at the top of the multi-layer stack 110.

The conductive layers 111-118 can be formed of a conductive semiconductor material, such as n-type poly-silicon, or n-type epitaxial single crystal silicon, doped with phosphorus or arsenic. Alternatively, the conductive layers 111-118 can be formed of p-type poly-silicon, or p-type epitaxial single crystal silicon, doped with boron. Still alternatively, the conductive layers 111-118 can be formed of un-doped semiconductor material, such as un-doped poly-silicon or un-doped epitaxial monocrystalline silicon. In the present embodiment, the conductive layers 111-118 are preferably formed of un-doped poly-silicon with a grain size ranging about 400 nm to 600 nm and a sheet resistance ranging about $10^7$ ohm/square to $10^{11}$ ohm/square. The thickness of each one of conductive layers 111-118 can be about 5 nm to 40 nm.

The insulating layers 121-128 can be formed of a dielectric material such as silicon oxide, silicon nitride, silicon oxynitride, silicate, or others. The thickness of each one of the insulating layers 121-128 can be about 10 nm to 50 nm. In some embodiments of the present invention, the conductive layers 111-118 and the insulating layers 121-128 can be formed by a deposition process, for example, a low pressure chemical vapor deposition (LPCVD) process.

Figure 2A:
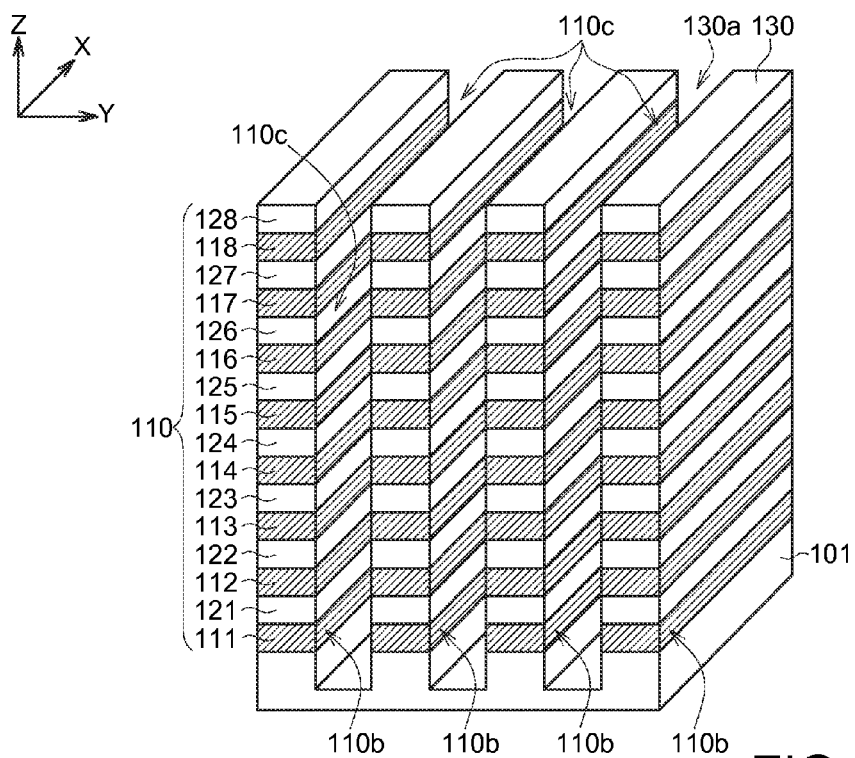
FIG. 2A is a prospective view illustrating the result after the process for patterning the multi-layer stack is performed on the structure depicted in FIG. 1A.
Figure 2B:
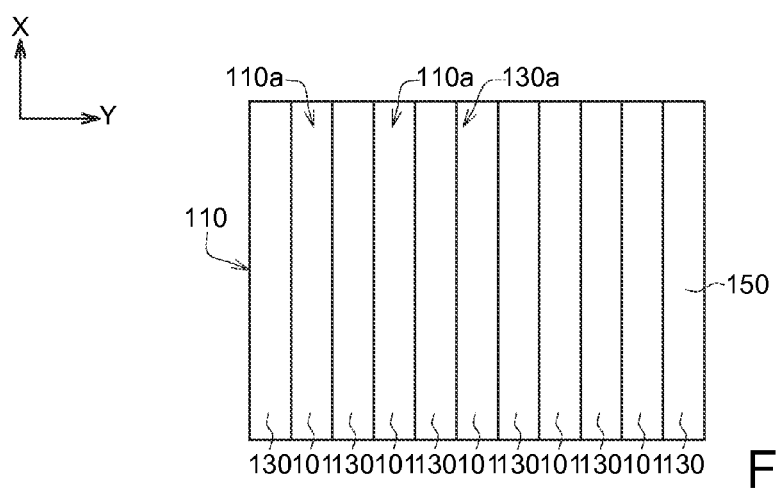
FIG. 2B is a top view illustrated in accordance with the structure depicted FIG. 2A.

Next, the multi-layer stack 110 is the patterned to form a plurality of ridge-shaped stacks 110b. FIG. 2A is a prospective view illustrating the result after the process for patterning the multi-layer stack 110 is performed on the structure depicted in FIG. 1A; FIG. 2B is a top view illustrated in accordance with the structure depicted in FIG. 2A. In some embodiments of the present invention, the process for patterning the multi-layer stack 110 comprises steps as follows: A patterned hard mask layer 130 is firstly provided on a top surface of the multi-layer stack 110. In the present embodiment, the patterned hard mask layer 130 is formed on the top surface of the insulating layer 128, and comprises a plurality of trench openings 130a extending along the Z-direction. Each of the trench openings 130a has a long axis extending along an X-direction; and a portion of the top surface of the insulating layer 128 is exposed from the trench openings 130a.

In some embodiments of the present invention, the hard mask layer 130 may be an advanced patterning film (APF) formed by a chemical vapor deposition (CVD) process to deposit the APF over the entire top surface of the multi-layer stack 110. These trench openings 130a are formed by a photolithography process that removes portions of the APF. In the present embodiment, these trench openings 130a are each formed in (but not limited to) a square shape having the same size.

Thereafter, the multi-layer stack 110 is etched by using the patterned hard mask layer 130 as an etching mask, to form a plurality of trenches 110a extending along the Z-direction until regions of substrate 101 is exposed by the trenches 110a, so as to divide the multi-layer stack 110 into a plurality of ridge-shaped stacks 110b. In the present embodiment, each of the ridge-shaped stacks 110b comprises a portion of the conductive layers 111-118 each of which is shaped as a conductive stripe 105 used for connecting the memory cells of the 3D memory device 100 subsequently formed on a corresponding level of the multi-layer stack 110 in series.

Figure 3A:
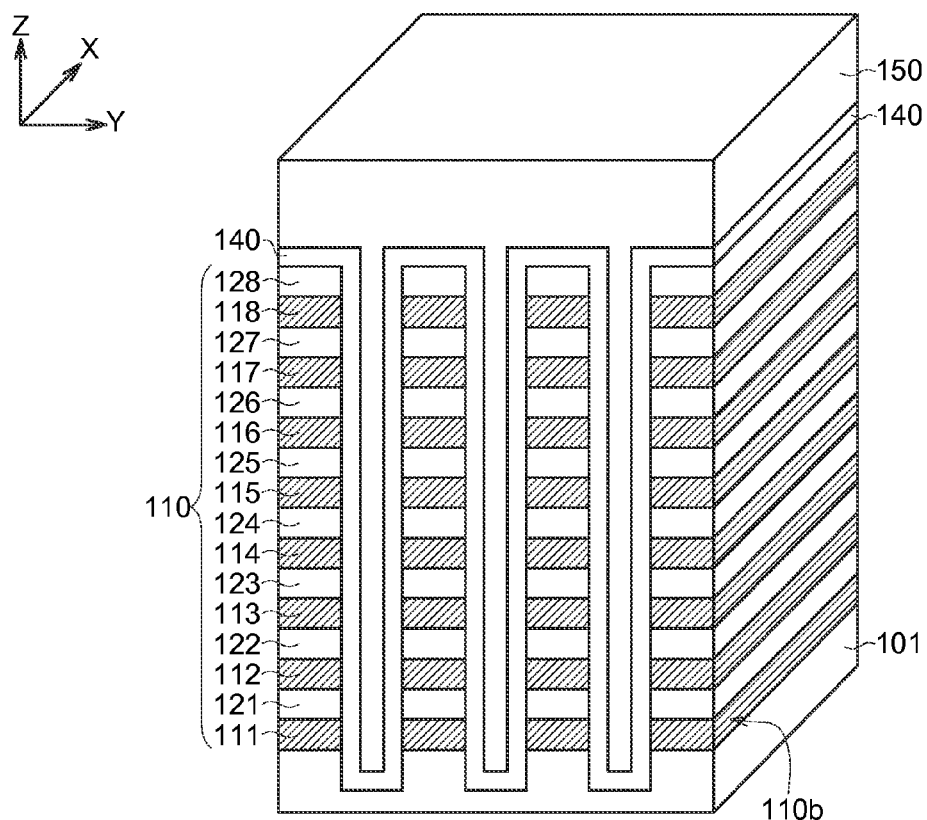
FIG. 3A is a prospective view illustrating the result after a memory material layer and a conductive material are sequentially formed on the structure depicted in FIG. 2A.
Figure 3B:
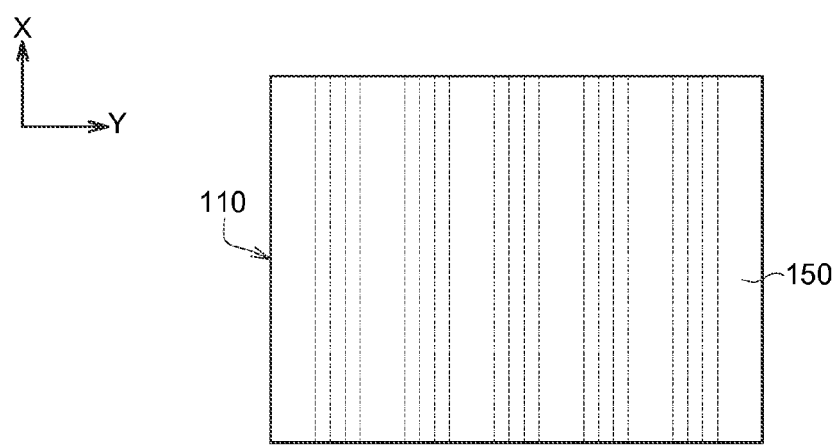
FIG. 3B is a top view illustrated in accordance with the structure depicted in FIG. 3A.

FIG. 3A is a prospective view illustrating the result after a memory material layer 140 and a conductive material 150 are sequentially formed on the structure depicted in FIG. 2A; FIG. 3B is a top view illustrated in accordance with the structure depicted in FIG. 3A. In some embodiments of the present invention, the memory material layer 140 may be formed of a composite layer (i.e., an ONO layer) including a silicon oxide layer, a silicon nitride layer, and a silicon oxide layer, by a LPCVD process. In the present embodiment, the memory material layer 140 is formed on the top surfaces of the ridge-shaped stacks 110b as well as the sidewalls 110c and the bottom (i.e., the surface of the substrate that is exposed from the trenches 110a) of the trenches 110a.

After the memory material layer 140 is formed, the conductive material layer 150 is formed on the ridge-shaped stacks 110b in a manner of blanket over the memory material layer 140 and filling the trenches 110a. In some embodiments of the present invention, the conductive material layer 150 may be formed by a LPCVD process. The conductive material layer 150 may be formed of an electrically conductive material, such as n+-type poly-silicon (n-type epitaxial single crystal silicon) doped with phosphorus or arsenic, p+-type poly-silicon (p-type epitaxial single crystal silicon) doped with boron or un-doped polysilicon. Alternatively, conductive material layer 150 may be formed of silicide, such as TiSi, CoSi, or SiGe, oxide semiconductor, such as InZnO or InGaZnO, metal, such as Al, Cu, W, Ti, Co, Ni, TiN, TaN, or TaAlN, or a combination of two or more of these materials.

Figure 4A:
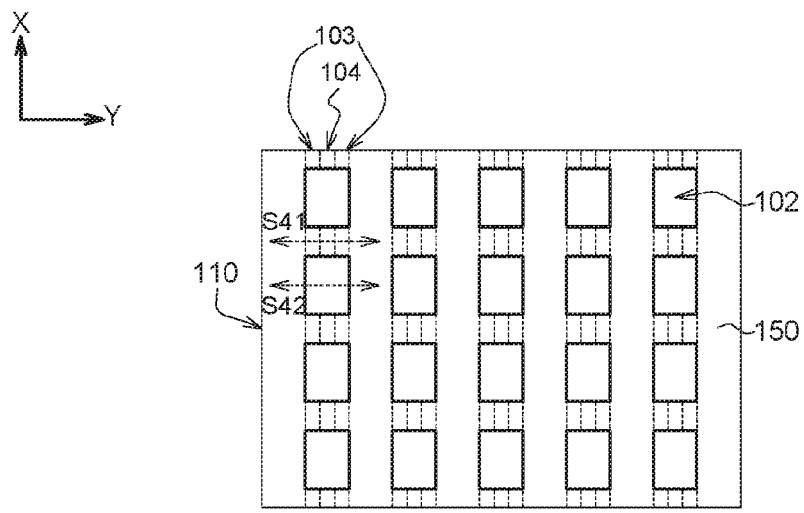
FIG. 4A is a top view illustrating the result after the process for patterning the conductive material layer and the memory material layer is performed on the structure depicted in FIG. 3B.
Figures 4B, 4C:
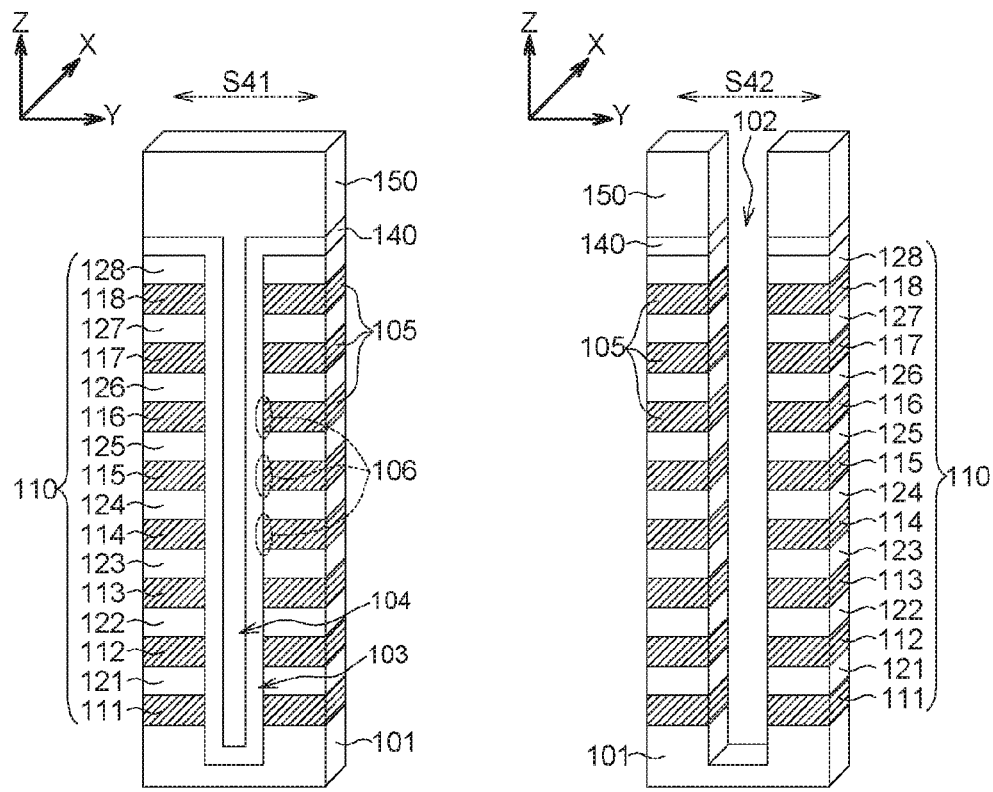
FIG. 4B is a prospective view of the structure taken along with the line S41 depicted in FIG. 4A.
FIG. 4C is a prospective view of the structure taken along with the line S42 depicted in FIG. 4A.

Subsequently, the conductive material layer 150 and the memory material layer 140 are patterned to define a plurality of through holes 102 passing through the trenches 110a, so as to expose portions of the conductive stripes and the substrate 101. As a result, the portion of the patterned memory material layer 140 disposed in the trench 110a are divided into a plurality of memory layers 103; and the portion of the patterned conductive material layer 105 disposed in the trench 110a are divided into a plurality of conductive pillars 104. FIG. 4A is a top view illustrating the result after the process for patterning the conductive material layer 150 and the memory material layer 140 is performed on the structure depicted in FIG. 3B. FIG. 4B is a prospective view of the structure taken along with the line S41 depicted in FIG. 4A. FIG. 4C is a prospective view of the structure taken along with the line S42 depicted in FIG. 4A.

In some embodiments of the present invention, the through holes 102 can be formed by an anisotropic etching process, such as a reactive ion etching (RIE) process, removing a portion of the conductive material layer 150 and the memory material layer 140 filled in the trenches 110a, whereby a portion of the conductive stripes 105 are exposed from the sidewalls of the through holes 102; and the portions of the conductive material layer 150 and the memory material layer 140 that are remained in the trenches 110a can be respectively defined as the plurality of conductive pillars 104 and the plurality of memory layers 103 extending along the Z-direction.

In the present embodiment, each ach of the memory layer 103 overlaps with portions of the conductive stripes 105 that are exposed from the trench 110a but not exposed by the through holes 102, whereby a memory area 106 can be defined on a position of a certain memory layer 103 where it overlaps with one of the conductive stripes 105. Each of the conductive pillars 104 is disposed adjacent to and directly in contact with one memory layers 103 and overlaps with the memory areas 106 defined on the corresponding memory layers 103. As a result, a memory cell can be constituted by portions of a memory layer 103, a conductive pillar 104 and a conductive stripe 105 overlapped with an identical memory area 106, and the plurality of memory cells defined by the plurals of the memory layers 103, the conductive pillars 104 and the conductive stripes 105 can be arranged as a memory array of the 3D memory device 100.

However, it should appreciated that, some of the memory areas 106 that are defined by the memory layers 103 and the conductive stripes 105 located at the peripheral region of the memory array may serve as active areas of string select transistors or grounding select transistors of the 3D memory device 100; and the corresponding conductive pillars 104 overlapped with the active areas are respectively connected to corresponding string select Lines (SSLs) or grounding select Lines (GSLs).

Figure 5A:
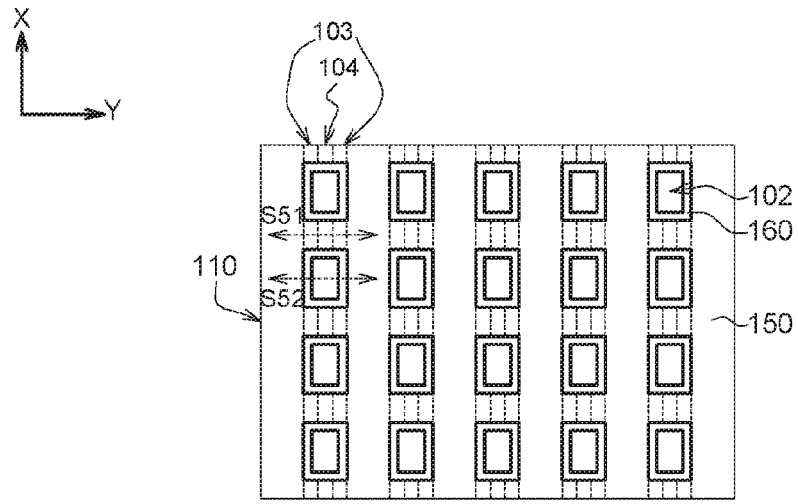
FIG. 5A is a top view illustrating the result after the dielectric layer is formed on the structure depicted in FIG. 4A.
Figures 5B, 5C:
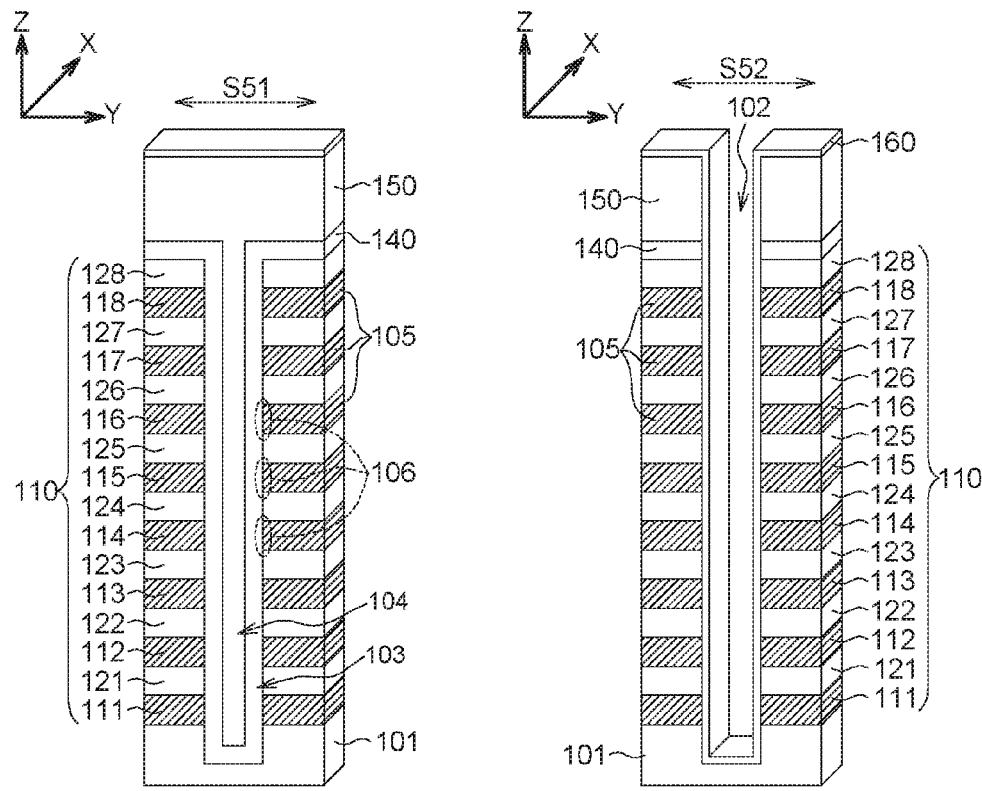
FIG. 5B is a prospective view of the structure taken along with the line S51 depicted in FIG. 5A.
FIG. 5C is a prospective view of the structure taken along with the line S52 depicted in FIG. 5A.

Then, a dielectric layer 160 is formed on the sidewalls of the through holes 102 (comprising the portions of the conductive stripes exposed from the through holes 102) and the surface of the substrate 101 exposed from the through holes 102. FIG. 5A is a top view illustrating the result after the dielectric layer 160 is formed on the structure depicted in FIG. 4A. FIG. 5B is a prospective view of the structure taken along with the line S51 depicted in FIG. 5A. FIG. 5C is a prospective view of the structure taken along with the line S52 depicted in FIG. 5A.

The dielectric layer 160 can also be formed by a deposition process, such as a LPCVD process. The material for constituting the dielectric layer 160 can be similar to that for constituting the insulating layers 121-128. In some embodiments of the present invention, the dielectric layer 160 can be formed of a dielectric material such as silicon oxide, silicon nitride, silicon oxynitride, silicate, or others. In the present embodiment, the dielectric layer 160 may comprise silicon oxide. The dielectric layer 160 has a thickness preferably ranging between 3 nm to 10 nm.

Next, a plurality of conductive plugs 108 are formed to partially fill each of the through holes, so as to make each of the conductive plugs 108 at least partially overlapping the corresponding conductive stripes 105 that is exposed from a corresponding through hole 102. FIG. 6A is a top view illustrating the result after the conductive plugs 108 are formed on the structure depicted in FIG. 5A. FIG. 6B is a prospective view of the structure taken along with the line S61 depicted in FIG. 6A. FIG. 6C is a prospective view of the structure taken along with the line S62 depicted in FIG. 6A. In the present embodiment, each of the conductive plugs 108 should be filled in a corresponding through hole 102 with a level higher than the bottom of the highest layer of the conductive stripes 105 that are exposed from the corresponding through hole 102. In other words, each of the conductive plugs 108 are surrounded by the dielectric layer 160 (see FIG. 6A) and has a height measured from the surface of the substrate 101 exposed from the through hole 102 greater than that of the top of the conductive layers 118 (see FIG. 6C).

Figure 7A:
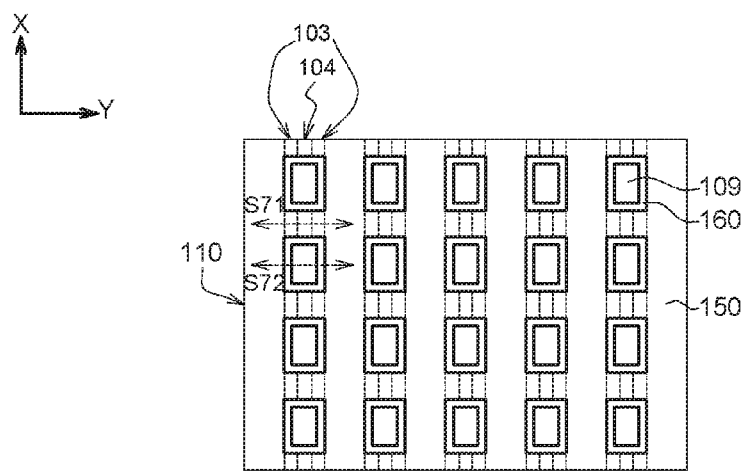
FIG. 7A is a top view illustrating the result after the dielectric plugs are formed on the structure depicted in FIG. 6A.
Figures 7B, 7C:
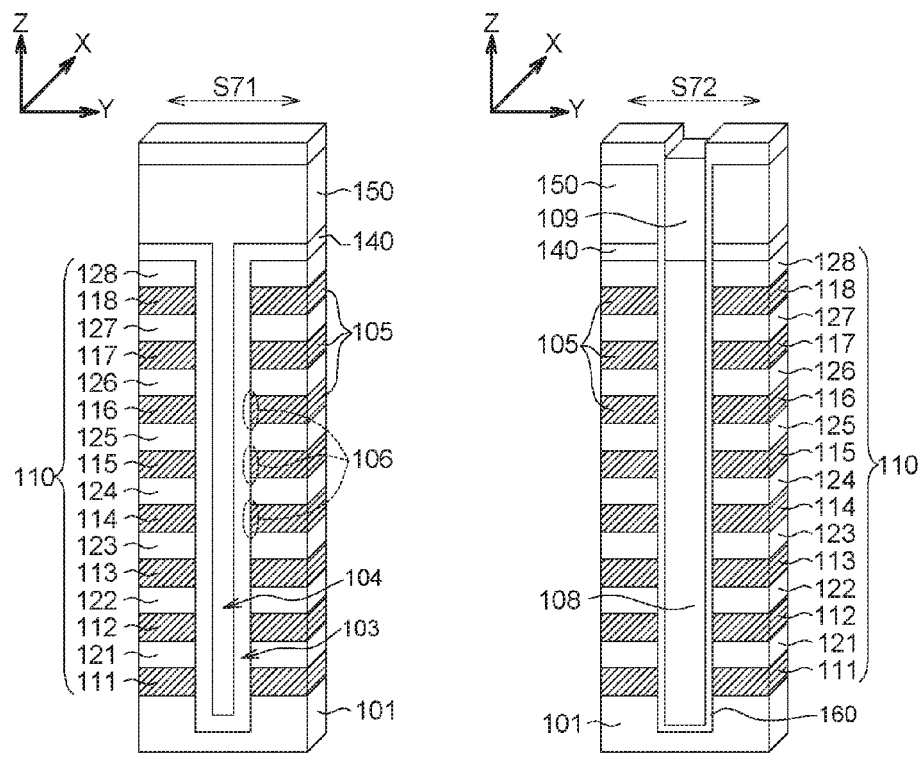
FIG. 7B is a prospective view of the structure taken along with the line S71 depicted in FIG. 7A.
FIG. 7C is a prospective view of the structure taken along with the line S72 depicted in FIG. 7A.

Thereafter, a plurality of dielectric plugs 109 are formed on the conductive plug 108 to fill the through holes 102 and connecting with the dielectric layer 160. FIG. 7A is a top view illustrating the result after the dielectric plugs 109 are formed on the structure depicted in FIG. 6A. FIG. 7B is a prospective view of the structure taken along with the line S71 depicted in FIG. 7A. FIG. 7C is a prospective view of the structure taken along with the line S72 depicted in FIG. 7A. The dielectric plugs 109 can also be formed by a deposition process, such as a LPCVD process. The material for constituting the dielectric plugs 109 can be similar to that for constituting the dielectric layer 160. In some embodiments of the present invention, the dielectric plugs 109 can be formed of a dielectric material such as silicon oxide, silicon nitride, silicon oxynitride, silicate, or others. In the present embodiment, the dielectric plugs 109 may comprise silicon oxide.

Figure 8A:
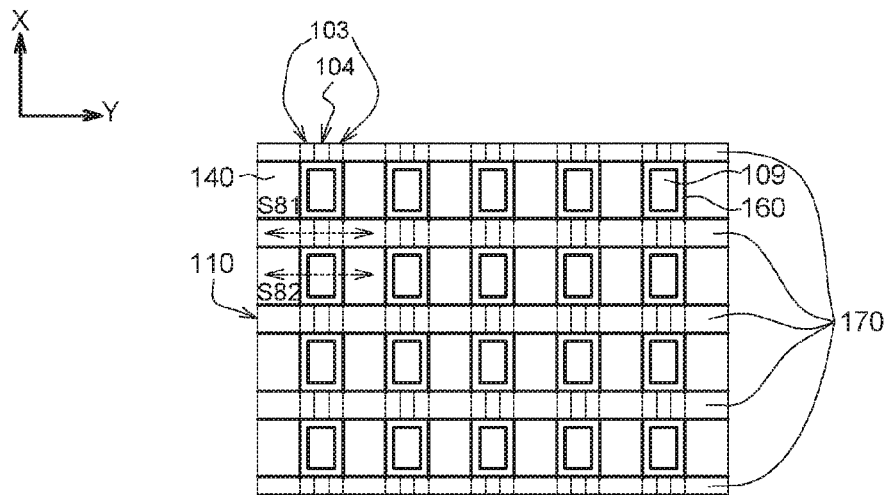
FIG. 8A is a top view illustrating the result after another patterning process is performed on the patterned conductive material layer depicted in FIG. 7A.
Figure 8B:
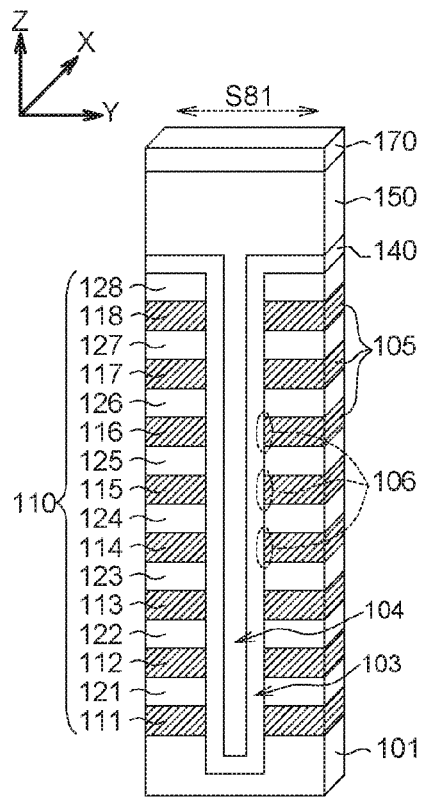
FIG. 8B is a prospective view of the structure taken along with the line S81 depicted in FIG. 8A.
Figure 8C:
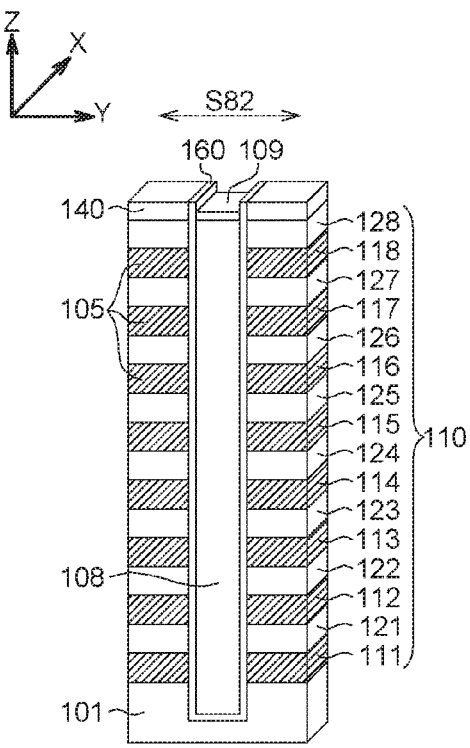
FIG. 8C is a prospective view of the structure taken along with the line S82 depicted in FIG. 8A.

Subsequently, another patterning process is performed on the patterned conductive material layer 150 to form at least one word line 170 extending along a Y direction on the top surfaces of the ridge-shaped stacks 110b and electrically connected to the conductive pillars 104. FIG. 8A is a top view illustrating the result after another patterning process is performed on the patterned conductive material layer 150 depicted in FIG. 7A. FIG. 8B is a prospective view of the structure taken along with the line S81 depicted in FIG. 8A. FIG. 8C is a prospective view of the structure taken along with the line S82 depicted in FIG. 8A. In the present embodiment, a plurality of word lines 170 are formed on the top surfaces of the ridge-shaped stacks 110b; and each of which is connected with a plurality of the conductive pillars 104. A conductive plug 108 is arranged between two adjacent word lines 170, and the conductive plug 108 is insulated from the two adjacent word lines 170 by the dielectric layer 160 and a dielectric plug 109.

Figure 9:
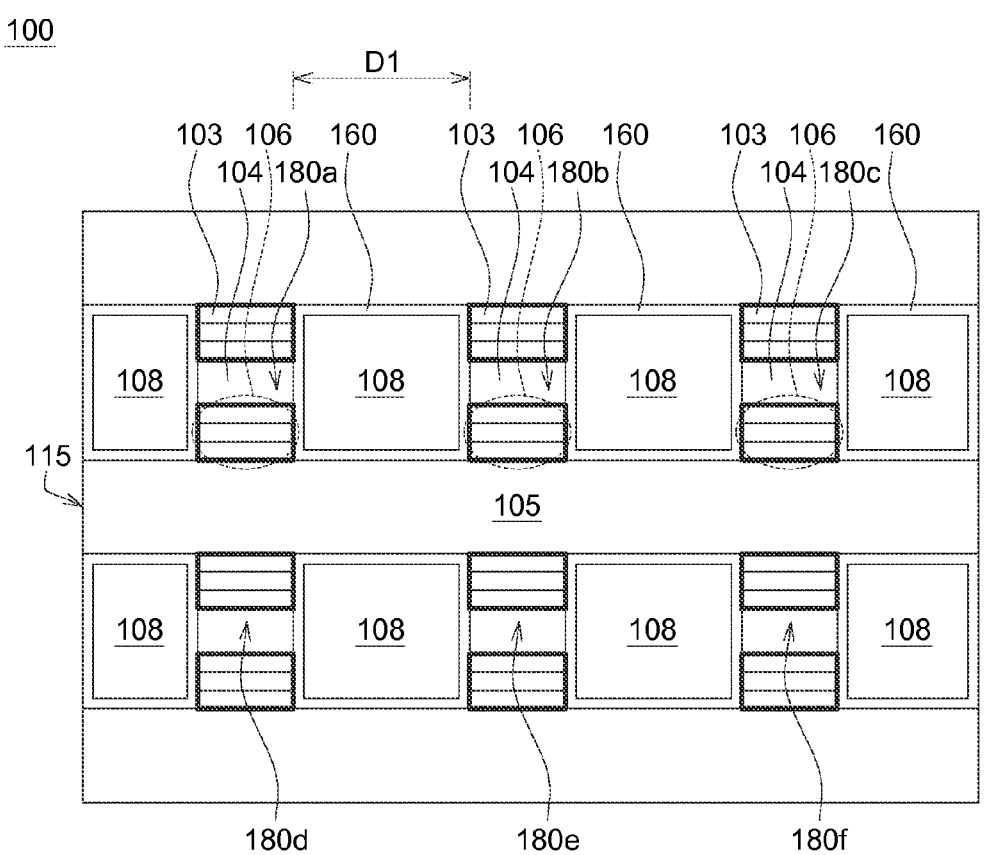
FIG. 9 is a cross sectional view illustrating a portion of a level structure taken along an X-Y plan of a 3D memory device in accordance with one embodiment of the present invention.

After a plurality of downstream processes (not shown) are carried out, the 3D memory device 100 is then formed, wherein the memory device 100 comprises a memory array with plurality of level structures formed on the conductive layers 111-118. FIG. 9 is a cross sectional view illustrating a portion of a level structure taken along an X-Y plan of the memory device 100 in accordance with one embodiment of the present invention. In the present embodiment, the level structure depicted in FIG. 9 is formed on the conductive layer 115. The level structure comprises a plurality of memory cells 180a, 180b, 180c, 180d, 180e and 180f electrically connected in series by a conductive striped formed by patterning the conductive layer 115 extending along the X direction.

Each of the memory cells 180a, 180b, 180c, 180d, 180e and 180f comprises a memory layer 103 and a conductive pillar 104, wherein the memory layer 103 extends along the Z direction (perpendicular to the X-Y plan) and overlaps with the conductive stripe 105, so as to define a memory area 106 at a position where the memory layer 103 overlaps with the conductive stripe 105. The conductive pillar 104 also extends along the Z direction adjacent to the memory layer 103 and overlaps with the memory area 106.

There is a distance D1 parallel to the X direction between two adjacent memory cells, such as the memory cells 180a and 180b, and there is a conductive plug 108 and a dielectric layer 160 disposed between the two adjacent memory cells 180a and 180b. The dielectric layer 160 extends along the Z direction and adjacent to directly in contact with the memory layers 103 and the conductive pillars 104 of the two adjacent memory cells 180a and 180b. The conductive plug 108 extends along the Z direction and at least overlaps with a portion of the conductive stripe 105 that extends along the X direction used to connect the two adjacent memory cells 180a and 180b in series. The dielectric layer 160 is disposed between the conductive plug 108 and each of the conductive stripe 105, the memory layers 103 and the conductive pillars 104 of the two adjacent memory cells 180a and 180b; and the dielectric layer 160 insulates the conductive plug 108 from the conductive stripe 105, the memory layers 103 and the conductive pillars 104 of the two adjacent memory cells 180a and 180b. Since the conductive plug 108 and the conductive stripe 105 are insulated from and at least partially overlapped with each other, thus the conductive plug 108 can serve as a floating gate electrode of the conductive stripe 105. When the memory device 100 performs an erase/program process, the conductive pillar 104 can be charged with a certain voltage; and an electric field couple with the nearby conductive pillar 104 may induce a voltage on the conductive plug 108. Thus, an inverse layer (not shown) may be formed in the conductive stripe 105 used to connect the two adjacent memory cells 180a and 180b in series due to the voltage potential induced on the conductive plug 108. As a result, the series resistance of the conductive stripe 105 connecting the two adjacent memory cells 180a and 180b may be reduced.

It is to be appreciated that, other level structure formed on other conductive layer, such as the conductive layer 114 disposed beneath the conductive layer 115, may also has similar structure. For example, the memory layer 103 and the conductive pillar 104 of the memory cell 180a may extend along the z direction to overlap the conductive stripe formed in the conductive layer 114, whereby another memory cell can be formed on the conductive layer 114. Because there is an insulating layers 124 disposed between the conductive layers 114 and 115, thus these two memory cells respectively formed on the conductive layers 114 and 115 separated from each other with a distance parallel to the Z direction.

In accordance with the aforementioned embodiments of the present invention, a memory device and method for fabricating the same are provided. In some embodiments of the present invention, the memory device comprises a plurality of level structures, and each of which comprises a plurality of memory cells connected in series by a conductive stripe extending along a first direction. Each of the memory cells has a memory layer and a conductive pillar extend along a second direction, wherein the memory layer overlaps with the conductive stripe and a memory area is defined on a position where the memory layer overlaps with the conductive stripe. The conductive pillar extends adjacent to the memory layer and overlaps with the memory area. A conductive plug parallel to the conductive pillars of two adjacent memory cells is provided between the two conductive pillars, wherein the conductive plug at least overlaps with a portion of the conductive stripe that connects the two memory cells in series, and is insulated from the two memory cells and the conductive stripe by a dielectric layer.

Due to the arrangement of the conductive plug and the dielectric layer that are disposed between the two adjacent memory cells, the conductive plug may serve as a floating gate of the conductive stripe. When the memory device performs an erase/program process, the conductive pillars of the memory cells may be charged with a certain voltage; and an electric field which may couple with the nearby conductive pillars may induce a voltage on the conductive plug. Thus, an inverse layer may be formed in the conductive stripe due to the voltage potential induced on the conductive plug. As a result, the series resistance of the conductive stripe connecting the two adjacent memory cells may be reduced. Therefore, it is not necessary to perform an ion implantation in order to reduce the series resistance of the cell strings during the process for fabricating a 3D NAND flash memory device; and the conventional problems, such as complex manufacturing process, high thermal budget and interference on erase/program operation can be resolved by the present approach.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a first conductive stripe, extending along a first direction;
   a first memory layer, extending along a second direction to overlap with the first conductive stripe, so as to define a first memory area at a position where the first memory layer overlaps with first the conductive stripe;
   a first conductive pillar, extending adjacent to the first memory layer along the second direction, directly in contact with the first memory layer and overlapping with the first memory area;
   a first dielectric layer, extending along the second direction and directly in contact with the first conductive stripe, the first memory layer and the first conductive pillar; and
   a first conductive plug extending along the second direction and at least overlapping with a portion of the first conductive stripe, wherein the first conductive plug is surrounded by the first dielectric layer and electrically insulated from the first conductive stripe, the first memory layer and the first conductive pillar by the first dielectric layer.

2. The memory device according to claim 1, further comprising:
   a second dielectric layer, extending along the second direction and disposed adjacent to the first conductive stripe, the first memory layer and the first conductive pillar; and
   a second conductive plug extending along the second direction and at least overlaps with a portion of the first conductive stripe, wherein the second conductive plug is electrically insulated from the first conductive stripe, the first memory layer and the first conductive pillar by the second dielectric layer.

3. The memory device according to claim 2, further comprising:
   a second memory layer, extending along the second direction and overlapping with the first conductive stripe, so as to define a second memory area at a position where the second memory layer overlaps with first the conductive stripe, wherein the first memory area separated from the second memory area for a first distance parallel to the first direction; and
   a second conductive pillar, extending adjacent to the second memory layer along the second direction and overlapping with the second memory area.

4. The memory device according to claim 3, further comprising:
   A second conductive stripe, extending along the first direction and overlapping with the first memory layer and the second memory layer, so as to respectively define a third memory area and a fourth memory area, wherein the first conductive pillar and the second conductive pillar respectively overlap with the third memory area and the fourth memory area; and
   an insulating layer, extending along the first direction and disposed between the first conductive stripe and the second conductive stripe.

5. The memory device according to claim 4, further comprising:
   a first word line, extending along a third direction and electrically contact with the first conductive pillar; and
   a second word line, extending along the third direction and electrically contact with the second conductive pillar;
   wherein the first conductive plug is disposed between the first word line and second word line and electrically insulated from the first word line and second word line.

6. The memory device according to claim 5, further comprising:
   a first dielectric plug, disposed on the first conductive plug and in contact with the first conductive plug and the first dielectric layer; and
   a second dielectric plug, disposed on the second conductive plug and in contact with the second conductive plug and the second dielectric layer.

7. The memory device according to claim 5, further comprising:
   a plurality of ridge-shaped stacks, extending along the first direction disposed on a substrate, wherein each of the ridge-shaped stacks comprises the first conductive stripe, the insulating layer and the second conductive stripe;
   wherein the first memory layer and the second memory layer are disposed in a trench defined by two of the ridge-shaped stacks and covers on a sidewall of the trench;
   the first conductive pillar and the second conductive pillar are disposed in the trench and respectively covers on the first memory layer and the second memory layer; and
   the first word line and the second word line are disposed on top surfaces of the ridge-shaped stacks.

8. The memory device according to claim 4, wherein the first conductive stripe and the second conductive stripe both comprise un-doped poly-silicon.

9. The memory device according to claim 1, wherein the dielectric layer has a thickness substantially ranging from 3 nm to 10 nm.

10. The memory device according to claim 1, further comprising:

a second memory layer, extending along the second direction to overlap with the first conductive stripe, so as to define an active area at a position where the second memory layer overlaps with first the conductive stripe; and a second conductive pillar, extending along the second direction, overlapping with the active area and connected to a string select Line (SSL).

11. The memory device according to claim 1, further comprising:

a second memory layer, extending along the second direction to overlap with the first conductive stripe, so as to define an active area at a position where the second memory layer overlaps with first the conductive stripe; and a second conductive pillar, extending along the second direction, overlapping with the active area and connected to a grounding select Line (GSL).

* * * * *